United States Patent [19]

Horng et al.

[11] 4,333,227
[45] Jun. 8, 1982

[54] PROCESS FOR FABRICATING A SELF-ALIGNED MICROMETER BIPOLAR TRANSISTOR DEVICE

[75] Inventors: Cheng T. Horng, San Jose, Calif.; Michael R. Poponiak, Newburgh; Hans S. Rupprecht, Yorktown Heights, both of N.Y.; Robert O. Schwenker, San Jose, Calif.

[73] Assignee: International Business Machines Corporation, Armonk, N.Y.

[21] Appl. No.: 224,705

[22] Filed: Jan. 12, 1981

Related U.S. Application Data

[62] Division of Ser. No. 98,588, Nov. 29, 1979, Pat. No. 4,303,933.

[51] Int. Cl.$^3$ .................... H01L 21/302; H01L 21/31
[52] U.S. Cl. .................................. 29/580; 29/576 E; 29/576 W; 29/578; 148/174; 148/175; 156/643; 156/653; 156/657; 357/20; 357/34; 357/50; 357/54; 357/56; 357/59
[58] Field of Search ................ 29/576 E, 576 W, 578, 29/580; 148/174, 175; 156/643, 653, 657; 357/20, 34, 50, 54, 56, 59

[56] References Cited

U.S. PATENT DOCUMENTS

| | | |
|---|---|---|
| 3,600,651 | 8/1971 | Duncan ............................. 357/59 X |
| 3,631,307 | 12/1971 | Naugler ............................ 357/34 X |
| 3,648,125 | 3/1972 | Peltzer ................................. 357/50 |
| 3,796,613 | 3/1974 | Magdo et al. ........................ 148/175 |
| 3,873,372 | 3/1975 | Johnson ................................ 148/1.5 |
| 3,904,450 | 9/1975 | Evans et al. ......................... 148/175 |
| 3,919,005 | 11/1975 | Schinella et al. ................... 148/175 |
| 3,947,299 | 3/1976 | Weijland et al. .................... 148/187 |
| 3,958,323 | 5/1976 | DeLa Moneda ..................... 29/571 |
| 3,961,999 | 6/1976 | Antipov .............................. 148/175 |
| 4,011,105 | 3/1977 | Paivinen et al. ..................... 148/1.5 |
| 4,048,649 | 9/1977 | Bohn ................................... 357/43 |
| 4,103,415 | 8/1978 | Hayes .................................. 29/571 |
| 4,104,086 | 8/1978 | Bondur et al. ....................... 148/1.5 |
| 4,139,442 | 2/1979 | Bondur et al. ..................... 204/192 E |
| 4,195,307 | 3/1980 | Jambotkar ......................... 357/34 X |
| 4,252,579 | 2/1981 | Ho et al. ............................. 148/174 |

FOREIGN PATENT DOCUMENTS 1514624  6/1978  United Kingdom .

OTHER PUBLICATIONS

Schmidt et al., "Conversion of Silicon Nitride Films to Anodic SiO$_2$" J. Electrochem. Soc., vol. 114, No. 6, Jun. 1967, pp. 603–605.

Primary Examiner—L. Dewayne Rutledge
Assistant Examiner—W. G. Saba
Attorney, Agent, or Firm—Wesley DeBruin

[57] ABSTRACT

A method for device fabrication utilizing a self-aligned process. A combination of advanced semiconductor processing techniques including Deep Dielectric Isolation by reactive-ion etching, etching and refilling, planarizing with oxides and resists, and differential thermal oxidation are used to form devices having small vertical as well as horizontal dimensions. The device region is surrounded by a deep oxide trench which has nearly vertical sidewalls which extend from the epitaxial silicon surface through the N+ subcollector region into the P substrate. The width of the deep trench is about 2 μm to 3 μm. A shallow oxide trench extends from the epitaxial silicon surface to the upper portion of the N+ subcollector and separates the base and collector contact. The surface of the isolation regions and the silicon where the transistor is formed is coplanar. As shown in FIG. 1, the fabricated bipolar transistor has a mesa-type structure. The transistor base dimension is only slightly larger than the emitter. This small base area results in a low collector-base capacitance which is a very important parameter in ultra-high performance integrated circuit devices. Contact to the transistor base in the disclosed structure is achieved by a thick heavily boron doped polysilicon layer which is formed by an etch and refill process and which surrounds the emitter and makes lateral contact to the active base.

6 Claims, 23 Drawing Figures

PROCESS FOR FABRICATING A SELF-ALIGNED MICROMETER BIPOLAR TRANSISTOR DEVICE

This is a division, of application Ser. No. 098,588 filed Nov. 29, 1979 now U.S. Pat. No. 4,303,933.

FIELD OF THE INVENTION

This invention relates to the fabrication and structure of semiconductor devices, and in particular to very small integrated circuit devices with very high speed and very low power performance.

A planar self-aligned bipolar transistor structure in which the emitter, base and collector are self-aligned. The structure is characterized in that (1) the emitter-base is very small in dimension and essentially flat (2) the base-collector junction is essentially flat, essentially equal in area to the emitter-base junction (3) a highly conductive polysilicon region laterally surrounds the vertical emitter, base and collector regions. First and second regions of insulating material respectively electrically isolate the emitter and collector from the polysilicon region which serves as a lateral connection to the active base and a metal base contact, and (4) the structure provides relatively wide spacing of the base, emitter and collectors contacts.

BACKGROUND OF THE INVENTION AND PRIOR ART

Numerous integrated circuit devices, structures and techniques of fabricating same, are known to the prior art. The following prior art patents and summaries are submitted to generally represent the state of the art.

Reference is made to U.S. Pat. No. 3,600,651 entitled "Bipolar and Field-Effect Transistor Using Polycrystalline Epitaxial Deposited Silicon" granted Aug. 17, 1971 to D. M. Duncan. The Duncan patent discloses adjacent layers of single crystalline and polycrystalline semiconductor material located upon a semiconductor.

Reference is made to U.S. Pat. No. 3,648,125 entitled "Method of Fabricating Integrated Circuits with Oxidized Isolation and the Resulting Structure", granted Mar. 7, 1972 to D. L. Peltzer. The Peltzer patent discloses a thin silicon epitaxial layer, formed on a silicon substrate, and subdivided into electrically isolated pockets by a grid of oxidized regions of epitaxial silicon material which extend through the epitaxial layer to a laterally extending PN junction.

Reference is made to U.S. Pat. No. 3,873,372 entitled "Method for Producing Improved Transistor Devices" granted Mar. 25, 1975 to W. S. Johnson. The Johnson patent discloses methods for fabricating insulated-gate field-effect transistor devices wherein the problem of accurately aligning the gate electrode over the channel region is particularly addressed and solved.

Reference is made to U.S. Pat. No. 3,904,450 entitled "Method of Fabricating Injection Logic Integrated Circuits Using Oxide Isolation" granted Sept. 9, 1975 to W. J. Evans et al. The Evans et al patent discloses an integrated injection logic circuit cell structure and its fabrication. A pattern of oxide isolation regions is used to define, at least partially, the introduction of two types of impurities in such a way as to reduce the number of masking steps. Certain of these oxide regions do not penetrate through the conventional epitaxial layer, leaving a lateral buried path to serve as the base of a lateral injection transistor. A pattern of polycrystalline silicon containing impurities is used both as a diffusion source and an interconnection.

Reference is made to U.S. Pat. No. 3,919,005 entitled "Method For Fabricating Double-Diffused, Lateral Transistor" granted Nov. 11, 1975 to R. D. Schinella et al. The Schinella et al patent discloses a double diffused lateral transistor structure fabricated utilizing an etch resistant mask to provide self-aligning positioned accuracy for formation of active areas of the transistor. The lateral structure includes semiconductor material having at least one substantially flat surface and the structure includes at least one region of insulating material formed adjacent the flat surface, the top surface of the insulating material being substantially coplanar with said one surface. A collector is formed in the semiconductor material adjacent first portions of both the flat surface and the insulating material, while an emitter is formed in the semiconductor material adjacent second portions of both the flat surface and the insulating material. A base separates the collector from the emitter.

Reference is made to U.S. Pat. No. 3,947,299 entitled "Method of Manufacturing Semiconductor Devices" granted Mar. 30, 1976 to B. H. Weijland et al. The Weijland et al patent discloses a method of making a semiconductor device for application in a monolithic integrated circuit wherein a local buried insulating layer is provided at the interface of a substrate and a semiconductive layer is locally converted into an insulator which extends down to the buried insulator. The method is useful among other things, for providing isolated semiconductor islands.

Reference is made to U.S. Pat. No. 3,958,323 entitled "Three Mask Self Aligned IGFET Fabrication Process" granted May 25, 1976 to F. H. DeLaMoneda. The DeLaMoneda patent discloses a process for making a self aligned IGFET having a polycrystalline silicon gate, using three masking steps. Layers of silicon dioxide, polycrystalline silicon, and silicon nitride are respectively deposited on the surface of a silicon substrate of a first conductivity type. With the first mask, openings are made in regions of these layers above the proposed location for the source and drain. The source and drain are then deposited in the substrate through these openings. The disclosed process continues, growing a silicon dioxide layer on the lateral surfaces of the polysilicon gate, exposed by these openings. Then a silicon nitride layer is deposited on all exposed surfaces and a second mask is employed to permit the removal by etching of this nitride layer from all portions except the proposed location of devices metallization at a first region over the gate, a second region over the source and a third region over the drain of the device. The polycrystalline silicon layer is then etched and removed from the field region of the device. Polysilicon material in the gate region is protected during this etching step by the first nitride layer and the silicon dioxide layer grown over the lateral exposed surfaces of the gate. The nitride layer regions are then etched away and metallized contacts are formed to the source, drain and polycrystalline silicon gate regions by means of a third and last mask. Alternative steps are disclosed for making the gate and field oxide regions coplanar.

Reference is made to U.S. Pat. No. 3,961,999 entitled "Method For Forming Recessed Dielectric Isolation with A Minimized 'Bird's Beak' Problem" granted June 8, 1976 to I. Antipov. The Antipov patent discloses a method for forming recessed silicon dioxide isolation in integrated circuits in which the "bird's beak" problems associated with conventional silicon dioxide silicon nitride composite masking structures is minimized. A conventional composite mask comprising a bottom layer of silicon dioxide and an upper layer of silicon nitride having a plurality of openings defining the regions in the silicon substrate which are to be thermally oxidized is formed on a silicon substrate. Recesses are then etched in the silicon substrate in registration with the openings in the composite mask. Then the silicon dioxide layer is, in effect, overetched to extend the openings in the silicon dioxide to greater lateral dimensions than the openings in the silicon nitride layer whereby the silicon nitride at the periphery of the openings is undercut. A layer of silicon is then deposited in the recesses covering the undercut portions of said silicon nitride layer. Then, the structure is subjected to thermal oxidation whereby the silicon in and abutting the recesses is oxidized to form regions of recessed silicon dioxide substantially coplanar with the unrecessed portions of the silicon substrate. Because of the undercutting and the deposition of silicon in the recesses, the "bird's beak" effect is minimized.

Reference is made to U.S. Pat. No. 4,011,105 entitled "Field Inversion Control for N-Channel Device Integrated Circuits" granted Mar. 8, 1977 to J. O. Paivinen et al. The Paivinen et al patent discloses improvement in the field inversion properties of integrated circuits incorporating N-channel MOS devices by using a silicon substrate whose bulk dopant concentration is low but whose local dopant concentration is high at the field surfaces under the field oxide separating the active surface areas where the individual N-channel MOS devices are formed. The differential doping between surface areas under the field oxide and the active surface areas of the substrate is done by non-selectively ion implanting boron into the substrate to form a uniform low resistivity layer, removing selected portions of the low resistivity layer to expose the unimplanted high resistivity substrate and forming the active devices at the unimplanted substrate portions. As an option, the unimplanted surface portion can be doped to an intermediate dopant concentration to improve performance. The remaining pattern of the low resistivity layer is covered with field oxide. The invention allows the use of relatively inexpensive, low dopant concentration substrates to conveniently manufacture high performance N-channel MOS integrated circuits.

Reference is made to U.S. Pat. No. 4,048,649 entitled "Superimposed V-Groove Isolated Bipolar and VMOS Transistors" granted Sept. 13, 1977 to R. Bohn. The Bohn patent discloses a semiconductor structure having a compatible mixture of bipolar and unipolar transistors. In that structure a monocystalline P-type silicon substrate is employed which has its 1-0-0 crystallographic planes at a face on which an n epitaxial layer was grown. The epitaxial layer is divided into electrically isolated parts by V-grooves that extend down through the epitaxial layer and have their apices terminating in the substrate. A thin silicon dioxide film coats the V-grooves and those grooves are filled with polycrystalline silicon. Where it is desired to use the polycrystalline silicon as the insulated gate of a field effect transistor, the polycrystalline silicon is electrically conductive. Bases for bipolar transistors are formed by diffusion of an appropriate impurity into selected areas of the epitaxial layer. The emitters, drains and sources are formed by diffusion of a different impurity. Each field effect transistor has its drain and source on adjacent parts of the epitaxial layer which are separated by the V-groove in which the gate is situated. The base and emitter of a bipolar transistor may be situated on one isolated part and the collector may be situated on an adjacent part separated by a V-groove having an electrically conductive polycrystalline filler.

Reference is made to U.S. Pat. No. 4,103,415 entitled "Insulated-Gate Field-Effect Transistor with Self-Aligned Contact Hole to Source or Drain" granted Aug. 1, 1978 to J. A. Hayes. The Hayes patent discloses an oxide layer interposed between the polysilicon gate and the contact hole to the source or drain of an insulated gate field-effect transistor to prevent electrical shorts between the gate and metal contact to the source or drain. The oxide dielectric layer enables the contact hole to be extremely close to the polysilicon gate without electrical shorts occurring therebetween, thereby eliminating the need for a minimum separation between the gate and contact hole.

Reference is made to United Kingdom Patent Specification No. 1,514,624 (complete specification published June 14, 1978).

The following is an excerpt from the United Kingdom Patent Specification No. 1,514,624:

In bipolar integrated circuits the functional elements are usually electrically insulated from one another by the use of special insulation-diffusion techniques.

An integrated circuit of this type can, for example, be produced by depositing onto a p-doped semiconductor substrate an n-doped epitaxial layer at the surface of which an oxide layer is subsequently formed. Conventional photolithographic methods are then used to etch a frame-like structure of interconnected windows into this oxide layer through which a p-diffusion (p+ indicating a high doping concentration) is effected to a depth at which the diffusion front overlaps the p-doping of the substrate. In this way n-doped regions are obtained which are entirely enclosed by a p-n junction. When the p-doped substrate and the p+ doped insulating frames are connected to the most negative potential, all the isolating p-n junctions are biased in the blocking direction. Deep diffusion of this kind inevitably involves a lateral diffusion beneath the oxide mask, so that zones of the functional elements of the circuit, e.g., p-doped base zones of n-p-n transistors, formed in the isolated regions, must always be spaced at an adequate distance from the isolating p-doped zones. This safety clearance is determined by the diffusion depths, adjustment tolerances and space requirement, for example, of a transistor, and is, therefore, to a large extent dependent upon the space required for isolating purposes.

In order to avoid this disadvantage, the so-called isoplanar technique has been devised. In this technique a thin silicon nitride layer is applied to the surface of a silicon epitaxial layer and is etched to form a required structure in known manner. Residual portions of the nitride layer serve as a mask for the etching of a frame-like trench structure in the epitaxial layer to an etching depth of approximately half the total thickness of the epitaxial layer. During a subsequent oxidation step, the silicon exposed in the etched trenches is locally transformed into silicon dioxide, the regions lying beneath the residual portions of the nitride layer remaining unaltered since the nitride layer has a masking action as regards oxidation. The oxidation is continued until the boundary of the oxide formed has passed the p-n junction between the epitaxial layer and substrate. As a result, beneath the residual portions of the nitride layer, there remain islands of silicon which are isolated from the substrate by a p-n junction and have isolating oxide frames at their lateral boundaries.

The present trend in semiconductor technology is toward large scale integration of devices with very high speed and low power performance. The parameters that are essential to such high performance bipolar transistor are low parasitic capacitances as realized by (a) shallow vertical junction structure and (b) small horizontal geometry. To achieve these goals it is necessary to make the devices in the integrated circuits as small as possible.

With the advance in semiconductor processing technologies, such as in the fields of ion implantation, deep dielectric isolation, electron beam and x-ray lithographies, reactive ion etching, advanced insulator and polysilicon deposition techniques, and metal lift-off processes, fabrication of the ultra-high performance integrated circuit devices can be achieved.

Ion-implantation provides a means for precisely controlling the total amount of impurity transferred to the wafer. The impurity depth distribution is accurately controlled by implant energy. Unlike the conventional thermal diffusion process ion implantation is not a high temperature process. Thus, by using photo-resist or metal masking, multiple impurity introduction operations can be achieved without resort to high temperatures. A final thermal drive-in diffusion is sufficient to anneal out the radiation damage caused by implantation, and obtain desired device junction depth. Consequently, integrated circuit devices can be made shallower, with greater precision of the impurity distribution using ion implantation technology.

As the semiconductor devices become shallower, it is desirable to reduce the overall junction area so as to reduce parasitic capacitance. Further reduction of device parasitic capacitance can be achieved by shrinking of device horizontal dimensions and using dielectric isolation. Dielectric isolation is a method of fabricating integrated circuits in which the device components are isolated by other than P-N junctions. A well known dielectric isolation namely "Recessed Oxide Isolation" (ROI) is a commonly used process in present day semiconductor technology. Using $Si_3N_4$ as the oxidation barrier, the ROI technique is done by etching grooves into the semiconductor wafer adjacent those regions in which PN junctions are to be formed. The silicon exposed by the grooves is then thermally oxidized to form recessed oxide regions providing dielectric isolation. The problem associated with the ROI is the formation of "bird's head" and "bird's beak" structure at the lateral edges of recessed oxide. The bird's head is undesirable because it can cause breaks or discontinuities in thin films covering the steps. The indefiniteness of bird's beak structure reduces the available active surface area and, therefore, imposes the need for wider tolerance of lateral dimension in the integrated circuit layout. A newly developed oxide isolation called "Deep Dielectric Isolation" (DDI) avoids the above mentioned ROI problem. The DDI process utilizes reactive-ion etching (RIE) to form deep narrow trenches into the wafer surrounding those regions in which devices are to be formed. [Reference is made to U.S. Pat. No. 4,104,086 entitled "Method For Forming Isolated Regions of Silicon Utilizing Reactive Ion Etching" granted Aug. 1, 1978 to J. A. Bondur et al., and U.S. Pat. No. 4,139,442 entitled "Reactive Ion Etching Method For Producing Deep Dielectric Isolation in Silicon" granted Feb. 13, 1979 to J. A. Bondur et al., respectively assigned to the assignee of the subject application]. The trenches are overfilled with $SiO_2$ put down by chemical vapor deposition (CVD) technique. The overfilled $SiO_2$ also planarizes the device surface. A blanket RIE back-etching to the semiconductor surface yields deep oxide isolation trenches. Unlike the bird's beak in ROI structure, sidewall of the DDI structure is nearly vertical. The surface of DDI regions and the silicon where devices are to be formed are coplanar. With the DDI, doping process for various device regions is then self-aligned by oxide isolation. The self-aligned process eliminates precise mask alignment steps and also saves a number of mask steps in the device fabrication.

As mentioned above the DDI enables us to form devices with considerably smaller cell size than those formed by using either P-N isolation or by ROI. Further reduction of device horizontal dimensions requires the use of high resolution capabilities of lithography and etching processes. The electron beam lithography is the most promising method for delineating submicron size device patterns. For device window opening the reactive ion etching (RIE) is the most attractive alternative of the conventional wet solution etching. The RIE is a dry process having directional etching characteristic. The etched device windows preserve the lithography defined etch mask dimensions, and the openings have vertical sidewalls. Thus, the E-beam lithography and reactive ion etching are compatible for fabricating very small device geometries.

For the very small bipolar transistor devices, as for example, micron size transistors, the base areas and, therefore, the collector-base parasitic capacitance is the most significant performance parameter. In the bipolar transistor the active base area is the region below the emitter. In the conventional transistors, fabricated by the prior art, the base contacts are formed above the inactive base area surrounding the emitter. The transistor base area that is needed to accommodate the emitter and base contacts is considerably larger than the active base area. To reduce the base area for making ultra-high performance bipolar transistors, a different approach in making base contact is desirable.

SUMMARY OF THE INVENTION

It is, therefore, an object of this invention to provide a method for fabricating very high performance integrated circuit semiconductor devices. By utilizing advanced semiconductor processing techniques, the transistor structure formed in accordance with the invention is as shown in FIGS. 1A, 1B and 1C. The method for device fabrication disclosed in this invention is a self-aligned process. The device formed has small vertical as well as horizontal dimensions. The device region is surrounded by a deep oxide trench which has nearly vertical sidewalls. The deep trench extends from the epitaxial silicon surface through N+ subcollector region into the P substrate. The width of the deep trench is about 2 $\mu$m to 3.0 $\mu$m. A shallow oxide trench extending from the epitaxial silicon surface to the upper portion of the N+ subcollector separates the base and collector contacts. The surface of the isolation regions and the silicon where the transistor is formed is coplanar.

As shown in FIG. 1, the fabricated bipolar transistor has a mesa-type structure. The transistor base dimension is only slightly larger than the emitter. This small base area results in low collector-base capacitance which is a very important parameter in ultra-high performance integrated circuit devices. Contact to the transistor base in the structure in accordance with the invention is achieved by a thick heavily boron doped polysilicon layer which surrounds the emitter and makes lateral contact to the active base. The P+ polysilicon layer, which provides low base resistance, is formed within the oxide isolation trenches, thus minimizing the parasitic capacitance. The transistor active base is formed in place by a low dosage boron implantation made with its concentration peak below the emitter. The device thus formed will have a controllable narrow base width and a low external base resistance. Both are essential to provide high speed performance devices.

The emitter of the structure, in accordance with the invention is separated from the P+ polysilicon by a $Si_3N_4/SiO_2$ composite dielectric layer. This dielectric separation ensures that electrons injected into the base do occur at the bottom of the emitter. The dielectric sleeve of the emitter also eliminates the sidewall hole current component normally existing in conventional transistors. Thus, the bipolar transistors formed by the process, in accordance with the invention, has a high emitter injection efficiency and also has high transistor current gains.

Furthermore, the fabricated small geometry devices have planarized surfaces. The planarized device structure ensures the thin film covering which is critical to the integration of very small devices.

DESCRIPTION OF THE PREFERRED EMBODIMENTS

Figure 1A:
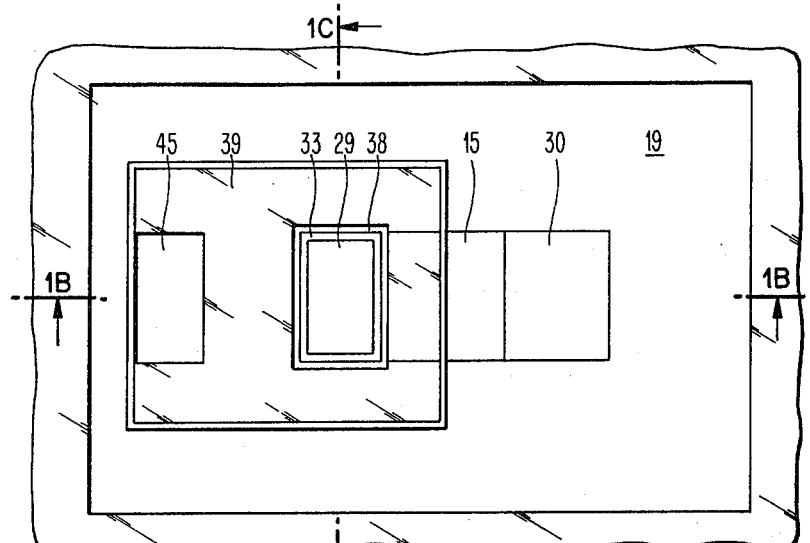
FIG. 1A is a top view of a transistor structure in accordance with the invention.
Figure 1B:
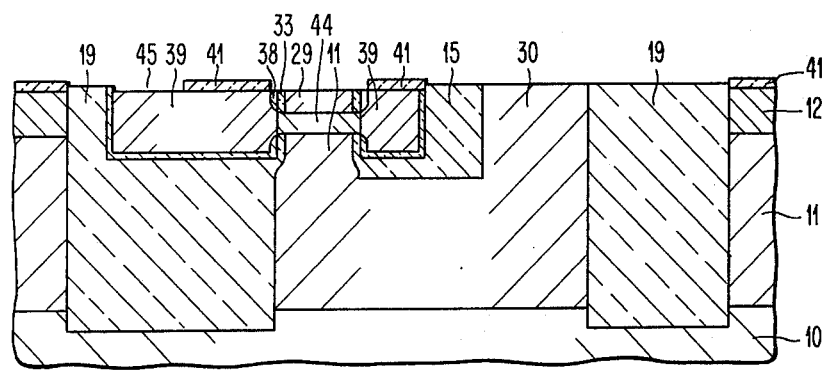
FIG. 1B is a cross-sectional view taken along the line 1B—1B of FIG. 1A.
Figure 1C:
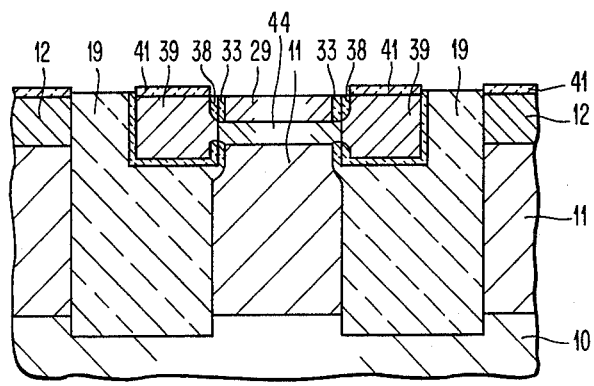
FIG. 1C is a cross-sectional view taken along the line 1C—1C of FIG. 1A.
Figure 2:
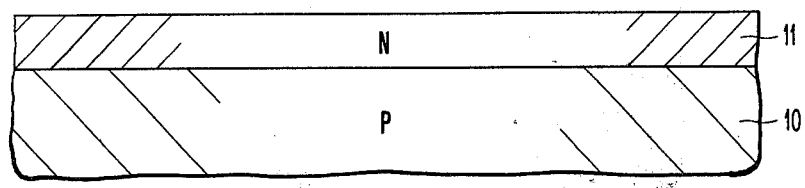
FIGS. 2 through 21 are cross-sectional views disclosing the structure at successive stages, or steps, in the process in accordance with the invention.
Figure 3:
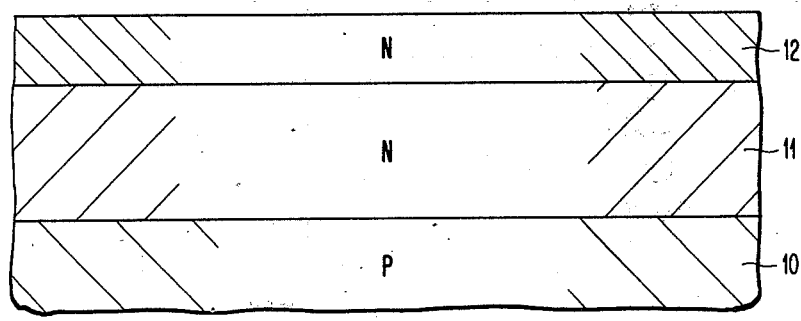
Figure 4:
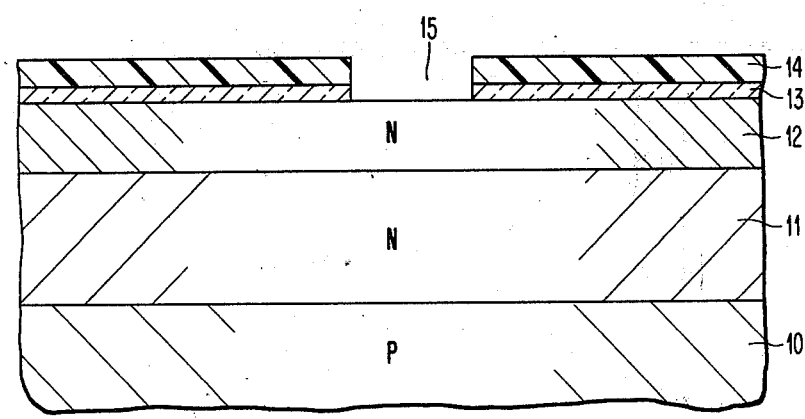

Referring now to the figures of the drawings and FIG. 2 in particular, a P-type monocrystalline silicon wafer 10 is the starting substrate. An N-type impurity is then introduced into wafer 10 forming the subcollector 11. The impurity can be any suitable N-type impurity, as for example, arsenic, and can be introduced into the wafer by any suitable technique as for example, capsule diffusion or ion implantation. The resistivity of the N-subcollector layer 11 is approximately 0.001 ohm-cm. As shown in FIG. 3, an N-type epitaxial silicon layer 12 of approximately 1.0 $\mu$m to 1.5 $\mu$m thickness is deposited on the surface of 11. During the epitaxial deposition process, which is a high temperature process, the subcollector region 11 diffuses upward into the region 12. The resistivity of the epitaxial layer is about 0.3 ohm-cm. As shown in FIG. 4, an oxide layer 13, preferably deposited by using chemical vapor deposition techniques, of approximately 3000 Å thickness is deposited on layer 12. A resist layer 14 is deposited over oxide layer 13 and subsequently exposed and developed to form an opening 15 which overlies the position of the shallow dielectric isolation trench to be fabricated. The resist layer 14 serves as a mask for reactive-ion etching oxide layer 13. The etching is stopped when it reaches the surface of epitaxial silicon 12. The resist layer 14 is then stripped.

Figure 5:
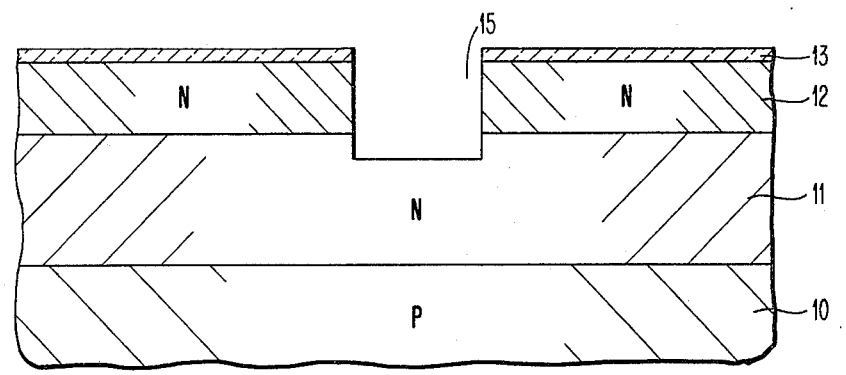

Referring to FIG. 5, using the oxide layer 13 as an etch mask, the exposed silicon in region 15 is then etched by a reactive-ion etching technique. The etching will be stopped when it reaches to the N+ subcollector region 11. The remaining oxide mask layer 13 is stripped by a chemical solution, for example, buffer-HF solution.

Figure 6:
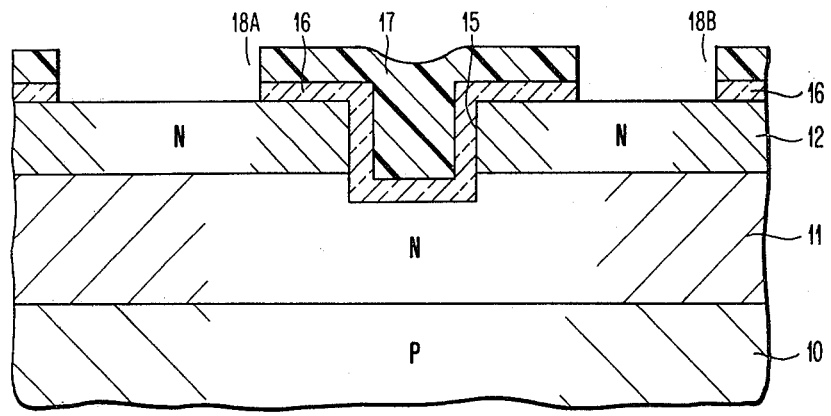

Referring to FIG. 6, a CVD oxide layer 16, approximately 6000–7000 Å thick, is then deposited on the wafer surface 12. A resist layer 17 is deposited and subsequently exposed and developed to form window 18 (18A and 18B) which overlies the position of the deep dielectric isolation trench to be fabricated. The resist layer 17 serves as a mask for the reactive-ion etching of oxide layer 16. The etching is stopped when the silicon layer 12 is reached. The resist layer is then stripped. Using the oxide layer 16 as shown in FIG. 6, as an etch mask, the exposed silicon in region 18 is reactive-ion etched.

Figure 7:
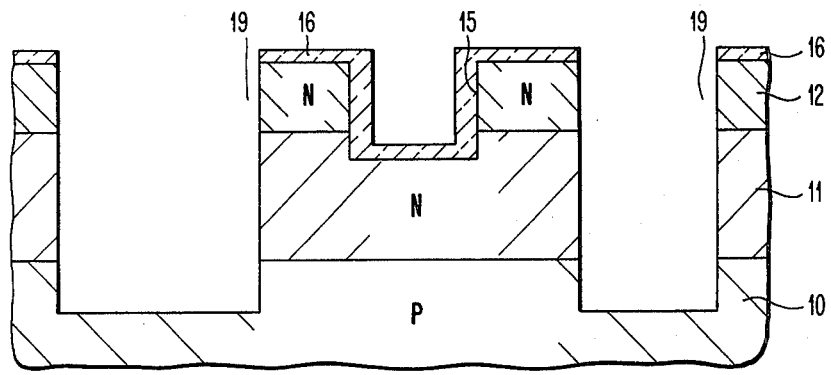

As shown in FIG. 7, the reactive-ion etching is stopped when it etches through epitaxial layer 12, subcollector layer 11 and reaches into the P substrate 10 to form deep trench 19 (19A and 19B). The depth of the deep trench 19 is approximately 4–5 $\mu$m. The remaining masking oxide 16 is then stripped.

Figure 8:
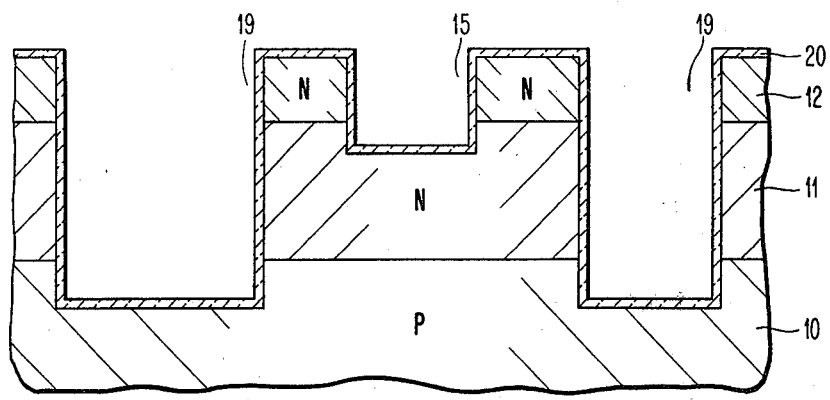

As shown in FIG. 8, the wafer is thermally oxidized to form an oxide layer 20 over the exposed silicon surface. The thickness of the thermal oxide grown is about 1000–2000 Å.

Figure 9:
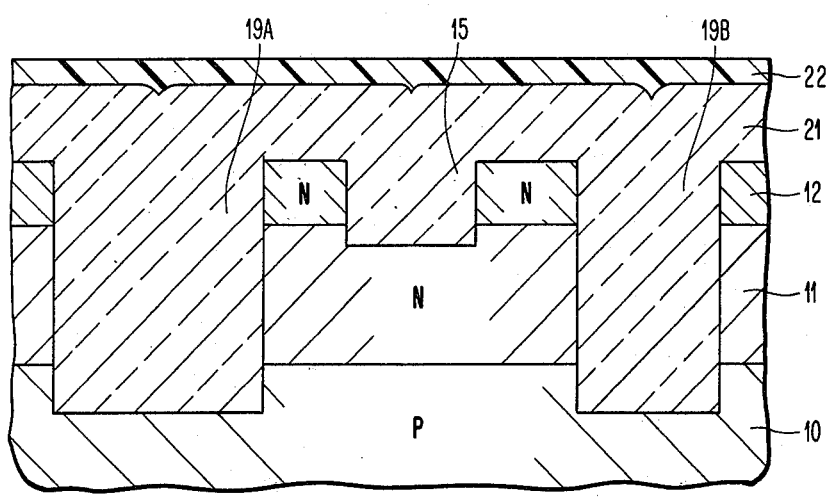
Figure 10:
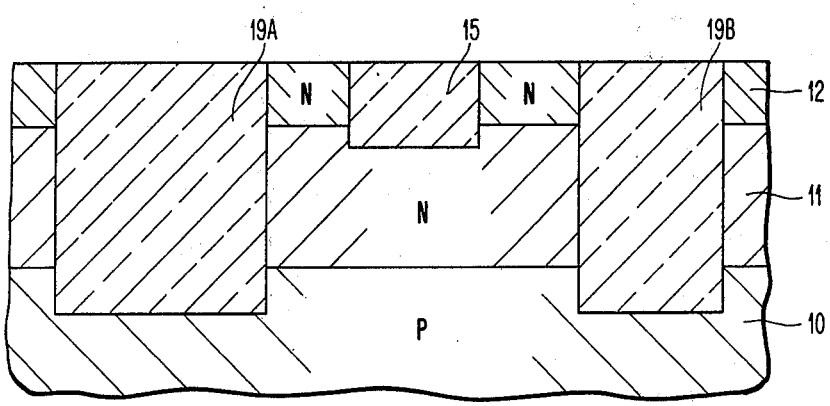

Referring to FIG. 9, a thick oxide layer 21, formed by the CVD technique, is used to fill the shallow trench 15 and deep trench 19 and also planarizes the wafer surface. For a 3 $\mu$m wide deep trench the oxide thickness required to overfill the trench is about 3 $\mu$m. As shown in FIG. 9, crevice formation in the center area of the overfilled trenches may be present. In this case a blanket resist layer 22 may be applied and appropriately treated to planarize the surface 21. The subsequent process step is the use of RIE to thin back the resist layer 22 and the oxide layer 21. Of primary importance is that the etch rate of RIE resist is nearly equal to that of RIE $SiO_2$. Thus, with an equal thickness of resist and $SiO_2$ everywhere over the wafer, a back-etching to the silicon will yield a planar surface with filled in deep trench 19 and shallow trench 15, as shown in FIG. 10.

Figure 11:
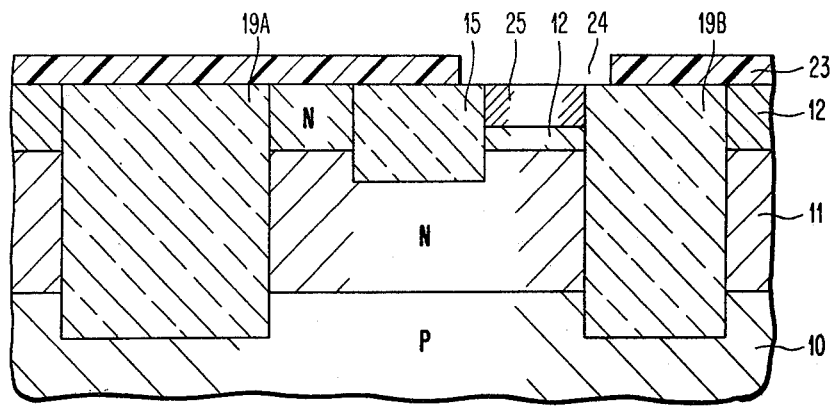

As depicted in FIG. 11, a resist layer 23 is deposited on the wafer surface. The resist layer 23 is exposed and developed to form a block-out opening 24 which overlies the intended transistor reach-through region. A suitable N-type impurity preferably phosphorous, is ion implanted into the epitaxial layer 12 to form reach-through region 25. The resist layer 23 is then stripped.

Figure 12:
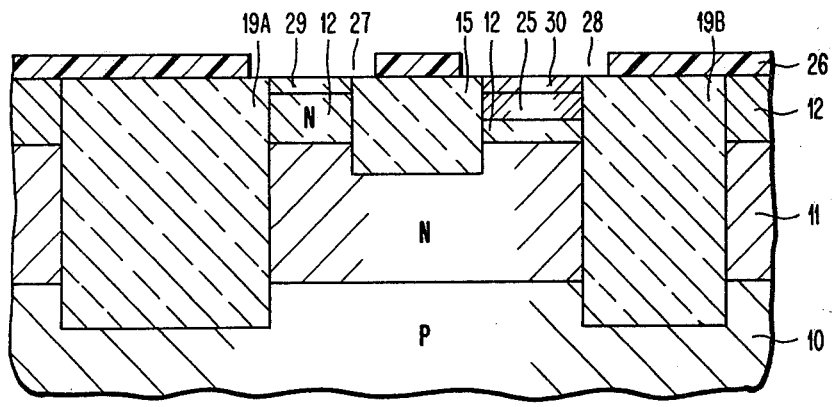

As shown in FIG. 12, a resist layer 26 is deposited on the wafer. Subsequently, the resist layer 26 is exposed and developed to form block out windows 27 and 28 for arsenic implant into the emitter 29 and collector contact 30. Arsenic ion-implantation, as for example, can be done at an energy on the order of 40 to 50 keV with a dosage in the range of 2.0 to $4.0 \times 10^{15}$ ions per square centimeter. The resist layer 26 is removed and the device heated to anneal and drive-in the emitter 29 and collector region 30 further into the epitaxial layer 12.

Figure 13:
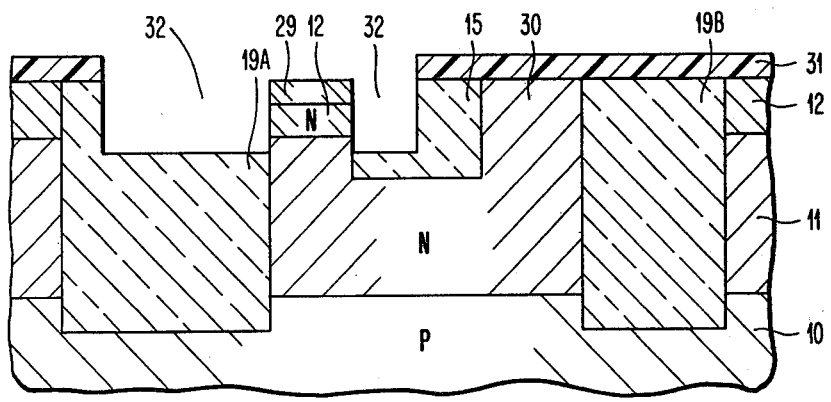

As demonstrated in FIG. 13, a resist layer 31 is applied and subsequently exposed and developed to form opening 32 which defines the intended polysilicon base contact region. The oxide defined by resist layer 31 is then etched by buffer-HF solution or by a reactive ion etching which has a very low silicon etch rate. The oxide etching is stopped when it has etched to the N+ subcollector level. The resist layer 31 is then stripped.

Figure 14:
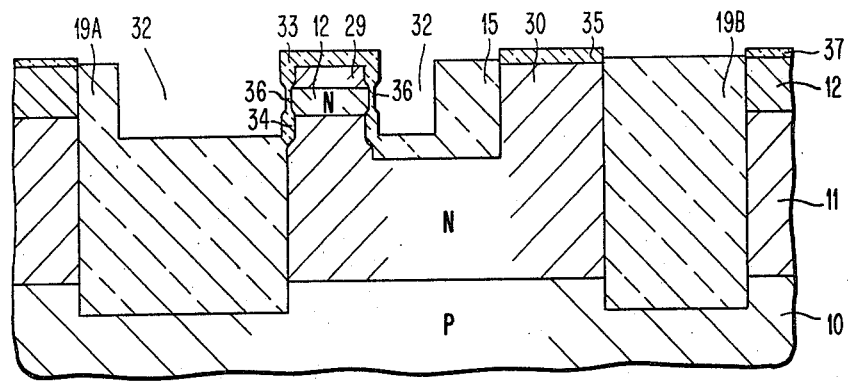

As shown in FIG. 14, the wafer is thermally oxidized at a relatively low temperature, preferably at 800° to 850° C., to form oxide over the exposed silicon. The low temperature oxidation results in forming thick oxide layers 33, 34 and 35 over the heavily doped N+ emitter 29, subcollector 11 and collector reach-through contact 30 respectively. The low temperature oxidation also forms thin oxide layers 36 and 37 on the lightly doped sidewall base contact and the surface of the epitaxial layer 12. As for example, in an 850° C. wet oxidation the oxide thicknesses grown on the heavily and lightly N-doped silicon are respectively 2000 Å and 500 Å. The oxidized wafer is then subject to a chemical solution etch such as buffer-HF solution, for a time sufficient to remove the thin oxide layers 36 and 37 but insufficient to remove the thick oxide layers 33, 34 and 35.

Figure 15:
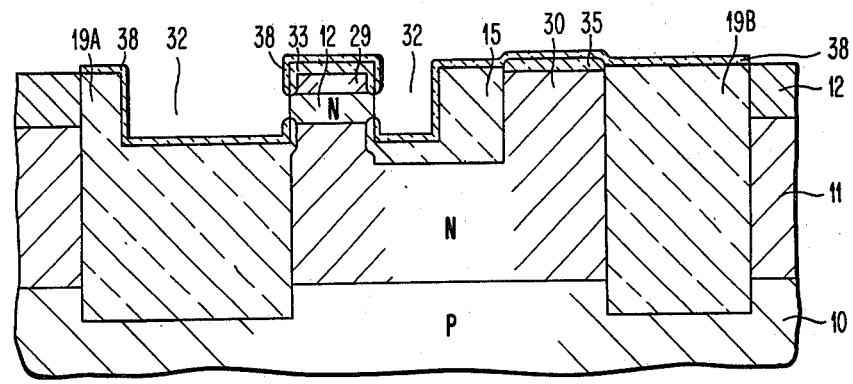

Referring now to FIG. 15, a silicon nitride ($Si_3N_4$) layer 38, approximately 1000 Å thick, is deposited onto the wafer by using a chemical vapor deposition process. The deposited $Si_3N_4$ layer 38 is conformal to the device structure. By using an anodization technique described by P. F. Schmitt and D. R. Wonsidler, "Conversion of $Si_3N_4$ Films to Anodic $SiO_2$", J. Electro-Chemical Soc. pp 603–605 (1967), the $Si_3N_4$ layer deposited on the exposed silicon regions 12 and 36 is converted to anodic $SiO_2$. The $Si_3N_4$ layer formed on the oxide layers 15, 19, 33, 34, 35 would not be anodized. The anodic $SiO_2$ is next removed by using a buffer-HF solution.

Figure 16:
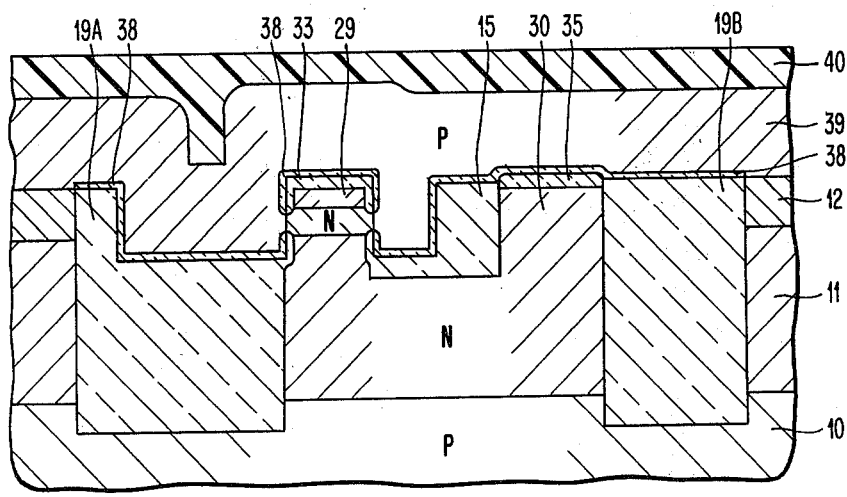

As shown in FIG. 16, a heavily doped P-type polysilicon layer 39 is deposited on the wafer. The polysilicon layer is formed preferably by low pressure CVD process to achieve good thickness uniformity. Doping of polysilicon layer 39 may be done in-situ during CVD. Alternatively, intrinsic polysilicon can be deposited and subsequently doped by boron implantation. A blanket resist layer 40 is next deposited and treated appropriately to planarize the polysilicon surface 39. The subsequent process step is to thin back the resist layer 40 and polysilicon layer 39 by use of RIE. The etch rate of RIE resist is preferably equal to that of RIE polysilicon.

Figure 17:
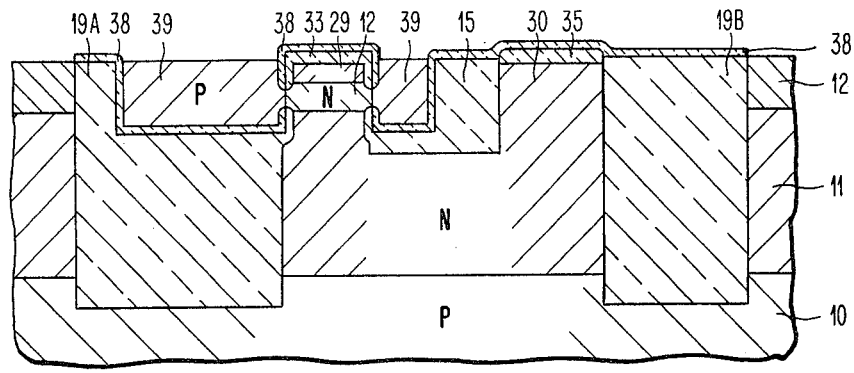

As shown in FIG. 17, RIE etch will be stopped when the $Si_3N_4$ surface 38 is reached.

Figure 18:
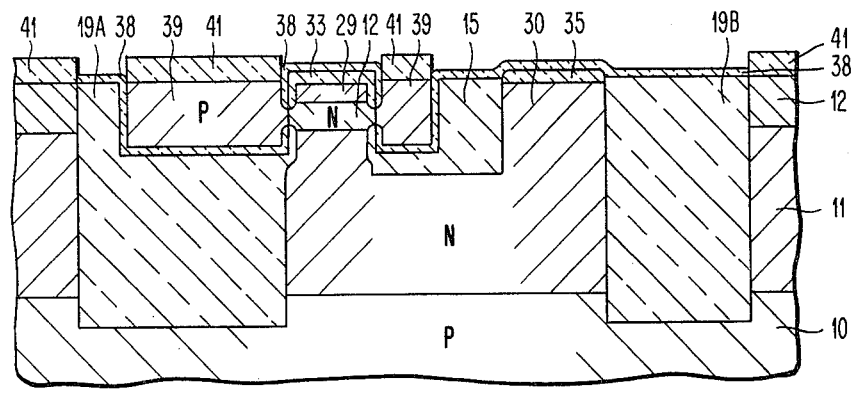

Referring to FIG. 18, a thermal oxidation is performed to grow a relatively thick oxide layer 41 on the exposed polysilicon 39 and the epitaxial surfaces 12. The thickness of oxide layer 41 should be much thicker than the oxide layer 33 formed on the emitter region 29. To minimize the outdiffusion of the P-type impurities from polysilicon 39 into epitaxial silicon 12 during oxide growth, preferably a high pressure oxidation should be used. Next, the $Si_3N_4$ layer 38 is stripped by using a hot $H_3PO_4$ solution. The oxide layers 33 and 35, respectively on the emitter 29 and collector contact 30, are then removed by the use of an RIE which has a very low etching rate on silicon. The oxide etching would be stopped when the underlying silicon is reached.

Figure 19:
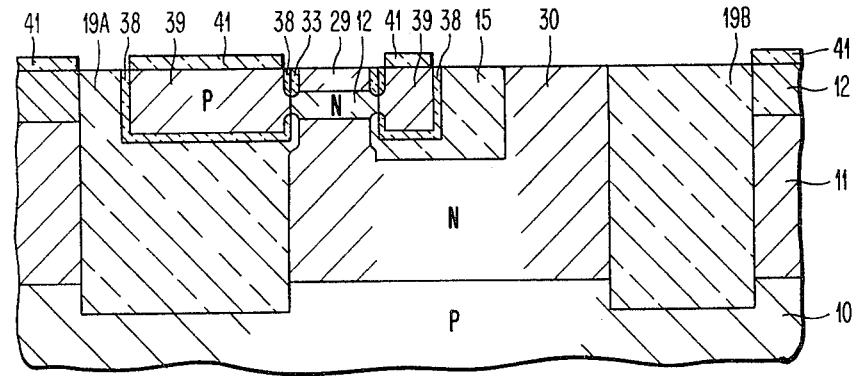

As shown in FIG. 19, the oxide layer 41 is still sufficiently thick for passivating the polysilicon surface 39.

Figure 20:
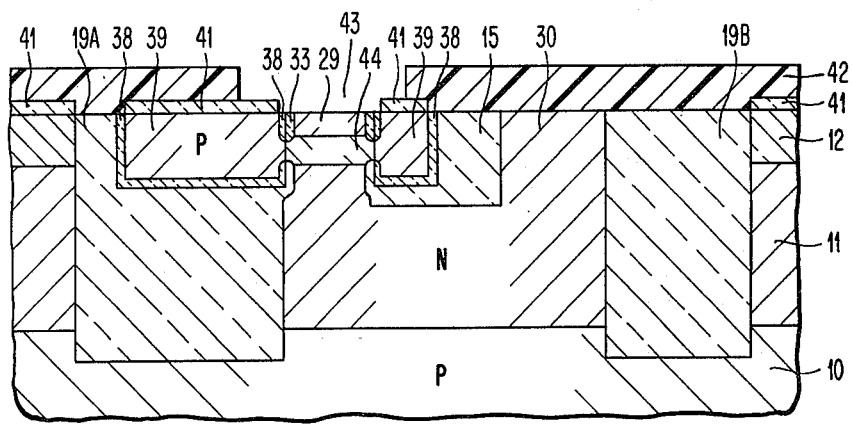

As depicted in FIG. 20, a resist layer 42 is applied and subsequently exposed and developed to form a block out window 43 for intrinsic base boron implantation. The boron implantation is made into epitaxial region 44 with its concentration peak below the emitter 29. The implantation is accomplished, for example, at an energy in the order of 40 keV with a dosage in the range of 0.5 to $2.0 \times 10^{13}$ ions per square centimeter. After implantation, the resist layer 42 is stripped. The device is then heat-treated at 900° C. to activate the implanted atoms.

Figure 21:
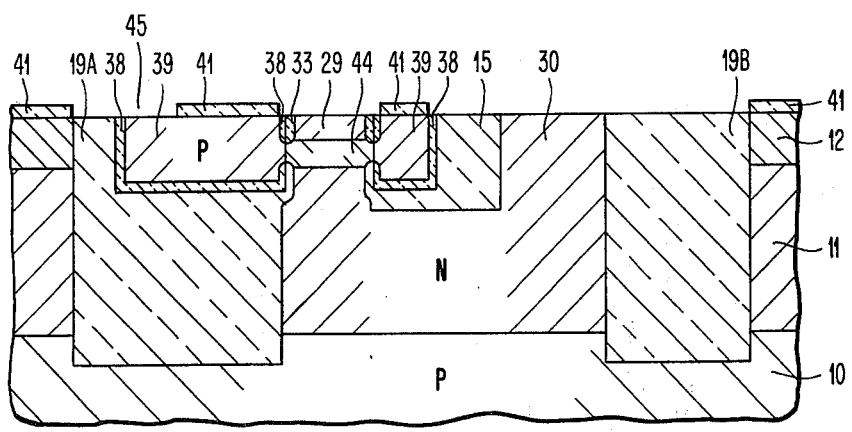

As shown in FIG. 21, a contact opening 45 to the P+ polysilicon is formed by lithography and an etching process. The device illustrated in FIG. 21 is now ready for deposition and fabrication of the metallurgy system which will interconnect the device shown with other devices including resistors and the like, all on the same substrate 10. The forming of the metallurgy system is well known in the art and it is deemed unnecessary that same be discussed or described.

While the invention has been particularly shown and described with reference to the preferred embodiments thereof, it will be understood by those skilled in the art that various changes in form and detail may be made therein without departing from the spirit and scope of the invention.

What is claimed is:

1. In a method of fabricating a planar vertical bipolar transistor structure on a silicon substrate of a first conductivity type having a planar surface, said structure including, a shallow depth epitaxial layer upon one surface of said substrate, said epitaxial layer having a substantially flat exposed top surface, an emitter region formed in said epitaxial layer, said emitter region having an exposed essentially planar surface, a base region formed in said epitaxial layer beneath said emitter region to provide a base-emitter junction, a collector region formed at least in part in said epitaxial layer beneath said base region to provide a base-collector junction, said structure having a said base-emitter junction which is essentially flat and has an area in the order of one square micron, said base-collector junction residing directly beneath and uniformly spaced from said base-emitter junction, and said base-collector junction being essentially flat and having an area in the order of one square micron, said method including the following steps:

(S1) introduce impurities of a second conductivity type into said planar surface of said substrate (FIG. 2, 10) to form a subcollector 11;

(S2) deposit an epitaxial layer (FIG. 3, 12) of a second conductivity type on said planar surface of said substrate;

(S3) deposit an oxide layer (FIG. 4, 13) on said planar surface of said substrate;

(S4) deposit a resist layer (FIG. 4, 14) on said oxide layer 13;

(S5) open a window (FIG. 4, 15) in said resist layer 14 and said oxide layer 13;

(S6) utilizing a reactive ion etch technique (FIG. 5) and window 15 etch the epitaxial layer 12 to the subcollector region 11 to provide a shallow trench;

(S7) deposit an oxide layer (FIG. 6, 16) on the exposed surface of said substrate;

(S8) deposit a resist layer (FIG. 6, 17) on said oxide layer 16;

(S9) open windows (FIG. 6, 18A, 18B) in said resist layer 17 and said oxide layer 16;

(S10) remove resist layer (FIG. 7, 17);

(S11) utilizing said oxide layer as a mask, employ a reactive ion etching technique to provide the enclosed deep trench (FIG. 7, 19A, 19B), the etching is stopped when it reaches the substrate 10;
(S12) remove the oxide layer (FIG. 7, 16);
(S13) deposit a thin oxide layer (FIG. 8, 20) on the exposed surface of the substrate;
(S14) deposit a thick oxide layer (FIG. 9, 21) to fill the shallow trench and deep trench (19A, 19B), said thick oxide layer 21 also substantially planarizing said exposed surface of said substrate;
(S15) deposit and utilize a blanket resist layer (FIG. 9, 22) on said thick oxide layer 21 to further planarize said exposed surface of said substrate;
(S16) reactive ion etch the exposed surface of the substrate to the surface of the epitaxial layer (FIG. 10, 12);
(S17) deposit a resist layer (FIG. 11, 23) and form an opening 24 in said layer;
(S18) introduce impurities of the second conductivity type via said window (FIG. 11, 24) into the epitaxial layer 12 to form reach through region 25;
(S19) remove the resist layer (FIG. 11, 23);
(S20) deposit a resist layer (FIG. 12, 26) on the exposed surface of the substrate;
(S21) form windows (FIG. 12, 27, 28) in the resist layer 26;
(S22) introduce impurities of a second conductivity type, via said windows 27, 28, into the exposed surface of said substrate to provide the emitter 29 and the collector contact 30;
(S23) remove the resist layer (FIG. 12, 26);
(S24) deposit a resist layer (FIG. 13, 31);
(S25) form a window (FIG. 13, 32) in the resist layer 31;
(S26) utilizing an etching technique that has a high etching rate of silicon dioxide as compared to silicon remove a portion of the shallow trench 15 and a portion of the deep trench (FIG. 13, 19A);
(S27) remove the resist layer (FIG. 13, 31);
(S28) and thermally oxidize at a relatively low temperature the exposed surface of the substrate, whereby the low temperature oxidation results in forming thick oxide layers (FIG. 14, 33, 34 and 35) over the emitter 29, subcollector 11 and collector reach through contact 30, and the low temperature oxidation results in relatively thin oxide layers 36 and 37 on the lightly doped sidewall base contact and surface of the epitaxial layer 12.

2. In a method of fabricating a planar vertical bipolar transistor structure on a silicon substrate of a first conductivity type, as recited in claim 1, wherein subsequent to step (S28) of claim 1 the following steps are performed:
(S1) subject the exposed surface of the substrate to a chemical etch solution of buffered-HF such that the thin oxide layers (FIG. 14, 36 and 37) are removed in total and the thick oxide layers (FIG. 14, 33, 34 and 35) are merely reduced;
(S2) deposit a silicon nitride layer (FIG. 15, 38) on the exposed surface of the substrate;
(S3) convert the portions of the silicon nitride layer (FIG. 15, 38) deposited on the exposed silicon regions (FIG. 15, 12, 36) to anodic silicon dioxide; and
(S4) subject the exposed surface of the substrate to a chemical etch solution of buffered-HF whereby said anodic silicon dioxide is removed from the exposed silicon regions (FIG. 15, 12, 36).

3. In a method of fabricating a planar vertical bipolar transistor structure on a silicon substrate of a first conductivity type, as recited in claim 2, wherein subsequent to step (S4) of claim 2, the following steps are performed:
(S1) deposit a polysilicon layer (FIG. 16, 39) containing impurities of a first conductivity type on the exposed surface of the substrate, said polysilicon layer being relatively thick;
(S2) deposit and utilize a blanket resist layer (FIG. 16, 40) on said relatively thick polysilicon layer (FIG. 16, 39) to planarize said exposed surface of said substrate; and
(S3) utilizing reactive ion etch techniques remove the photoresist layer (FIG. 16, 40) and thin back the polysilicon layer (FIG. 16, 39) to the silicon nitride layer (FIG. 17, 38).

4. In a method of fabricating a planar vertical bipolar transistor structure on a silicon substrate of a first conductivity type, as recited in claim 3, wherein subsequent to step (S3) of claim 3 the following steps are performed:
(S1) grow a relatively thick oxide layer (FIG. 18, 41) on the exposed surface of the polysilicon layer 39 and of the epitaxial layer 12;
(S2) remove the exposed portions of the silicon nitride layer (FIG. 18, 38);
(S3) remove the exposed portions of the oxide layer (FIG. 19, 33, 35) which respectively cover the emitter 29 and collector 30;
(S4) utilizing a resist layer (FIG. 20, 42) provide a block out window (FIG. 20, 43) for subsequent use in intrinsic base implantation; and
(S5) via said block out window (FIG. 20, 43) implant impurities of the first conductivity type to form an intrinsic base (FIG. 20, 44).

5. In a method of fabricating a planar vertical bipolar transistor structure on a silicon substrate of a first conductivity type having a planar surface, said structure including, a shallow depth epitaxial layer upon one surface of said substrate, said epitaxial layer having a substantially flat exposed top surface, an emitter region formed in said epitaxial layer, said emitter region having an exposed essentially planar surface, a base region formed in said epitaxial layer beneath said emitter region to provide a base-emitter junction, a collector region formed at least in part in said epitaxial layer beneath said base region to provide a base-collector junction, said structure having a said base-emitter junction which is essentially flat and has an area in the order of one square micron, said base-collector junction residing directly beneath and uniformly spaced from said base-emitter junction, and said base-collector junction being essentially flat and having an area in the order of one square micron, said method including the following steps:
(S1) introduce impurities of a second conductivity type into said planar surface of said substrate to form a subcollector;
(S2) deposit an epitaxial layer of a second conductivity type on said planar surface of said substrate;
(S3) deposit an oxide layer on said planar surface of said substrate;
(S4) deposit a resist layer on said oxide layer;
(S5) open a window in said resist layer and said oxide layer;

(S6) utilizing a reactive ion etch technique and said window etch the epitaxial layer to the subcollector region to provide a shallow trench;

(S7) deposit an oxide layer on the exposed surface of said substrate;

(S8) deposit a resist layer on said oxide layer;

(S9) open windows in said resist layer and said oxide layer;

(S10) remove resist layer;

(S11) utilizing said oxide layer as a mask, employ a reactive ion etching technique to provide the enclosed deep trench, the etching is stopped when it reaches the substrate;

(S12) remove the oxide layer;

(S13) deposit a thin oxide layer on the exposed surface of the substrate;

(S14) deposit a thick oxide layer to fill the shallow trench and deep trench, said thick oxide layer also substantially planarizing said exposed surface of said substrate;

(S15) deposit and utilize a blanket resist layer on said thick oxide layer to further planarize said exposed surface of said substrate;

(S16) reactive ion etch the exposed surface of the substrate to the surface of the epitaxial layer;

(S17) deposit a resist layer and form an opening in said layer;

(S18) introduce impurities of the second conductivity type via said window into the epitaxial layer to form a reach through region;

(S19) remove the resist layer;

(S20) deposit a resist layer on the exposed surface of the substrate;

(S21) form windows in the resist layer;

(S22) introduce impurities of a second conductivity type, via said windows, into the exposed surface of said substrate to provide the emitter and the collector contact;

(S23) remove the resist layer;

(S24) deposit a resist layer;

(S25) form a window in the resist layer;

(S26) utilizing an etching technique that has a high etching rate of silicon dioxide as compared to silicon remove a portion of the shallow trench and a portion of the deep trench;

(S27) remove the resist layer;

(S28) and thermally oxidize at a relatively low temperature the exposed surface of the substrate, whereby the low temperature oxidation results in forming thick oxide layers over the emitter, subcollector and collector reach through contact, and the low temperature oxidation results in relatively thin oxide layers on the lightly doped sidewall base contact and surface of the epitaxial layer 12;

(S29) subject the exposed surface of the substrate to a chemical etch solution of buffered-HF such that the thin oxide layers are removed in total and the thick oxide layers are merely reduced;

(S30) deposit a silicon nitride layer on the exposed surface of the substrate;

(S31) convert the portions of the silicon nitride layer deposited on the exposed silicon regions to anodic silicon dioxide;

(S32) subject the exposed surface of the substrate to a chemical etch solution of buffered-HF whereby said anodic silicon dioxide is removed from the exposed silicon regions;

(S33) deposit a polysilicon layer containing impurities of a first conductivity type on the exposed surface of the substrate, said polysilicon layer being relatively thick;

(S34) deposit and utilize a blanket resist layer on said relatively thick polysilicon layer to planarize said exposed surface of said substrate;

(S35) utilizing reactive ion etch techniques remove the photoresist layer and thin back the polysilicon layer to the silicon nitride layer;

(S36) grow a relatively thick oxide layer on the exposed surface of the polysilicon layer and of the epitaxial layer;

(S37) remove the exposed portions of the silicon nitride layer;

(S38) remove the exposed portions of the oxide layer which respectively cover the emitter and collector;

(S39) utilizing a resist layer provide a block out window for subsequent use in intrinsic base implantation; and (S40) via said block out window implant impurities of the first conductivity type to form an intrinsic base.

6. In a method of fabricating a planar vertical bipolar transistor structure on a silicon substrate of a first conductivity type having a planar surface, said structure including, a shallow depth epitaxial layer upon one surface of said substrate, said epitaxial layer having a substantially flat exposed top surface, an emitter region formed in said epitaxial layer, said emitter region having an exposed essentially planar surface, a base region formed in said epitaxial layer beneath said emitter region to provide a base-emitter junction, a collector region formed at least in part in said epitaxial layer beneath said base region to provide a base-collector junction, said structure having a said base-emitter junction which is essentially flat and has an area in the order of one square micron, said base-collector junction residing directly beneath and uniformly spaced from said base-emitter junction, and said base-collector junction being essentially flat and having an area in the order of one square micron, said method including the following steps:

(S1) introduce impurities of a second conductivity type into said planar surface of said substrate (FIG. 2, 10) to form a subcollector 11;

(S2) deposit an epitaxial layer (FIG. 3, 12) of a second conductivity type on said planar surface of said substrate;

(S3) deposit an oxide layer (FIG. 4, 13) on said planar surface of said substrate;

(S4) deposit a resist layer (FIG. 4, 14) on said oxide layer 13;

(S5) open a window (FIG. 4, 15) in said resist layer 14 and said oxide layer 13;

(S6) utilizing a reactive ion etch techique (FIG. 5) and window 15 etch the epitaxial layer 12 to the subcollector region 11 to provide a shallow trench;

(S7) deposit an oxide layer (FIG. 6, 16) on the exposed surface of said substrate;

(S8) deposit a resist layer (FIG. 6, 17) on said oxide layer 16;

(S9) open windows (FIG. 6, 18A, 18B) in said resist layer 17 and said oxide layer 16;

(S10) remove resist layer (FIG. 7, 17);

(S11) utilizing said oxide layer as a mask, employ a reactive ion etching technique to provide the enclosed deep trench (FIG. 7, 19A, 19B), the etching is stopped when it reaches the substrate 10;

(S12) remove the oxide layer (FIG. 7, 16);
(S13) deposit a thin oxide layer (FIG. 8, 20) on the exposed surface of the substrate;
(S14) deposit a thick oxide layer (FIG. 9, 21) to fill the shallow trench and deep trench (19A, 19B), said thick oxide layer 21 also substantially planarizing said exposed surface of said substrate;
(S15) deposit and utilize a blanket resist layer (FIG. 9, 22) on said thick oxide layer 21 to further planarize said exposed surface of said substrate;
(S16) reactive ion etch the exposed surface of the substrate to the surface of the epitaxial layer (FIG. 10, 12);
(S17) deposit a resist layer (FIG. 11, 23) and form an opening 24 in said layer;
(S18) introduce impurities of the second conductivity type via said window (FIG. 11, 24) into the epitaxial layer 12 to form reach through region 25;
(S19) remove the resist layer (FIG. 11, 23);
(S20) deposit a resist layer (FIG. 12, 26) on the exposed surface of the substrate;
(S21) form window (FIG. 12, 27, 28) in the resist layer 26;
(S22) introduce impurities of a second conductivity type, via said windows 27, 28, into the exposed surface of said substrate to provide the emitter 29 and the collector contact 30;
(S23) remove the resist layer (FIG. 12, 26);
(S24) deposit a resist layer (FIG. 13, 31);
(S25) form a window (FIG. 13, 32) in the resist layer 31;
(S26) utilizing an etching technique that has a high etching rate of silicon dioxide as compared to silicon remove a portion of the shallow trench 15 and a portion of the deep trench (FIG. 13, 19A);
(S27) remove the resist layer (FIG. 13, 31);
(S28) and thermally oxidize at a relatively low temperature the exposed surface of the substrate, whereby the low temperature oxidation results in forming thick oxide layers (FIG. 14, 33, 34 and 35) over the emitter 29, subcollector 11 and collector reach through contact 30, and the low temperature oxidation results in relatively thin oxide layers 36 and 37 on the lightly doped sidewall base contact and surface of the epitaxial layer 12;
(S29) subject the exposed surface of the substrate to a chemical etch solution of buffered-HF such that the thin oxide layers (FIG. 14, 36 and 37) are removed in total and the thick oxide layers (FIG. 14, 33, 34 and 35) are merely reduced;
(S30) deposit a silicon nitride layer (FIG. 15, 38) on the exposed surface of the substrate;
(S31) convert the portions of the silicon nitride layer (FIG. 15, 38) deposited on the exposed silicon regions (FIG. 15, 12, 36) to anodic silicon dioxide;
(S32) subject the exposed surface of the substrate to a chemical etch solution of buffered-HF whereby said anodic silicon dioxide is removed from the exposed silicon regions (FIG. 15, 12, 36);
(S33) deposit a polysilicon layer (FIG. 16, 39) containing impurities of a first conductivity type on the exposed surface of the substrate, said polysilicon layer being relatively thick;
(S34) deposit and utilize a blanket resist layer (FIG. 16, 40) on said relatively thick polysilicon layer (FIG. 16, 39) to planarize said exposed surface of said substrate;
(S35) utilizing reactive ion etch techniques remove the photoresist layer (FIG. 16, 40) and thin back the polysilicon layer (FIG. 16, 39) to the silicon nitride layer (FIG. 17, 38);
(S36) grow a relatively thick oxide layer (FIG. 18, 41) on the exposed surface of the polysilicon layer 39 and of the epitaxial layer 12;
(S37) remove the exposed portions of the silicon nitride layer (FIG. 18, 38);
(S38) remove the exposed portions of the oxide layer (FIG. 19, 33, 35) which respectively cover the emitter 29 and collector 30;
(S39) utilizing a resist layer (FIG. 20, 42) provide a block out window (FIG. 20, 43) for subsequent use in intrinsic base implantation; and
(S40) via said block out window (FIG. 20, 43) implant impurities of the first conductivity type to form an intrinsic base (FIG. 20, 44).

* * * * *